(12) United States Patent
Ito

(10) Patent No.: US 6,353,565 B2
(45) Date of Patent: Mar. 5, 2002

(54) SEMICONDUCTOR DEVICE, SEMICONDUCTOR MEMORY DEVICE AND TEST-MODE ENTRY METHOD

(75) Inventor: Shigemasa Ito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/789,727

(22) Filed: Feb. 22, 2001

(30) Foreign Application Priority Data

Feb. 25, 2000 (JP) .......................................... 2000-049781

(51) Int. Cl.$^7$ ................................................. G11C 7/00
(52) U.S. Cl. .................................. 365/201; 365/189.05
(58) Field of Search ............................ 365/201, 189.05, 365/230.06

(56) References Cited

U.S. PATENT DOCUMENTS 6,169,695 B1 * 1/2001 Duesman ..................... 365/201
6,269,038 B1 * 7/2001 Itou et al. ..................... 365/201

* cited by examiner

Primary Examiner—Huan Hoang
(74) Attorney, Agent, or Firm—Arent Fox Kintner Plotkin & Kahn, PLLC

(57) ABSTRACT

A semiconductor device for reliably detecting an erroneous entry into a test mode in ordinary usage and for performing various operational tests at the time of shipment includes an internal circuit and a test-mode control circuit. The test-mode control circuit includes a first control circuit and a second control circuit. The test-mode control circuit operates the internal circuit in the test mode in accordance with a test mode command. The first control circuit inactivates at least a part of the internal circuit in accordance with the test mode command. The second control circuit activates at least the part of the internal circuit in accordance with a release command supplied following the test mode command.

8 Claims, 4 Drawing Sheets

SEMICONDUCTOR DEVICE, SEMICONDUCTOR MEMORY DEVICE AND TEST-MODE ENTRY METHOD

BACKGROUND OF THE INVENTION

The present invention relates to a semiconductor device, and, more particularly, to a test-mode setting circuit for a synchronous DRAM.

Before shipment of synchronous DRAMs (SDRAMs), a variety of tests, including a reliability test, are conducted. A test mode is entered in accordance with a command signal synchronous with an external clock signal. The test-mode entry command signals are not accessible to ordinary customers (hereinafter referred to as "users"). When a user erroneously enters a test mode, therefore, the user continues to use the SDRAM without noticing the erroneous entry. This shortens the service life of the device. It is therefore necessary to indicate to the user that such an erroneous entry has been made.

In prior art devices, when a user erroneously enters an SDRAM test mode, the column address strobe (CAS) latency is automatically altered to notify the user of the erroneous entry. Specifically, when an erroneous entry is made, the value of the CAS latency, which is "2" or "3" according to standard specifications, is changed to "1".

More recent SDRAMs maintain the CAS latency at a value of "1", making it impossible to change the value of the CAS latency to "1" when an erroneous entry is made. As a solution to this shortcoming, a scheme has been proposed to set the data input/output terminal of the input/output circuit of an SDRAM to a high-impedance state when an erroneous entry is made, thus disabling the data input/output operation and informing the user of the erroneous entry.

FIG. 1 is a schematic block diagram of a conventional SDRAM 50. The SDRAM 50 sets a data input/output terminal 7 of an input/output circuit 6 to a high-impedance state when an erroneous entry is made, thus disabling the data input/output operation.

An input buffer circuit 1 receives a clock signal CLK and various control signals CKE, CS, /RAS, /CAS and /WE. The control signals are buffered and supplied to a command decoder 2.

The command decoder 2 generates various command signals in accordance with the various control signals CKE, CS, /RAS, /CAS and /WE and sends the command signals to a peripheral circuit/memory core 3 and a plurality of test-mode decision circuits 4.

Multiple-bit address signals A0–An are supplied to the peripheral circuit/memory core 3 and the test-mode decision circuits 4 via an address buffer circuit 5.

The peripheral circuit/memory core 3 performs a data write operation or data read operation in accordance with the command signal supplied from the command decoder 2 and the address signals A0–An supplied from the address buffer circuit 5.

The peripheral circuit/memory core 3 is connected to an input/output circuit 6, which is further connected to the data input/output terminal 7.

In data read mode, data read from the peripheral circuit/memory core 3 is sent to an external circuit via the input/output circuit 6 and the data input/output terminal 7. In data write mode, on the other hand, write data supplied from the data input/output terminal 7 is written in memory cells (not shown) in the peripheral circuit/memory core 3 via the input/output circuit 6.

The test-mode decision circuits 4, each of which is provided for one of the test modes, receive the command signal from the command decoder 2 and the address signals A0–An. Based on the command signal and the address signals A0–An, the test-mode decision circuits 4 determine the test mode that is to be performed.

When detecting a test mode, each of the test-mode decision circuits 4 sends an associated one of, for example, test mode signals TEST1, TEST2, TEST3 and TEST4 to the peripheral circuit/memory core 3 and the test-mode output control circuit 8. The peripheral circuit/memory core 3 operates in the test mode that corresponds to the received test mode signal.

When the test-mode output control circuit 8 determines that the received test mode signal, TEST1, TEST2, TEST3 or TEST4, is a specific test mode signal that shortens the life of the device, it sends an output stop signal TESHIZ to the input/output circuit 6.

Upon reception of the output stop signal TESHIZ, the input/output circuit 6 sets the data input/output terminal 7 to a high-impedance state.

FIG. 3 is a schematic circuit diagram of the input/output circuit 6 of the SDRAM 50.

A node between CMOS output transistors Tr1 and Tr2 is connected to the data input/output terminal 7. The output signal of an OR circuit 9 is supplied to the gate of the transistor Tr1, and the output signal of a NOR circuit 10a is supplied to the gate of the transistor Tr2.

Read data RD is supplied to the OR circuit 9 via a data bus, and is supplied to the NOR circuit 10a via an inverter circuit 13d. The output stop signal TESHIZ is supplied to the OR circuit 9 and the NOR circuit 10a. A NOR circuit 10b is supplied with write data Din supplied to the data input/output terminal 7 and the output stop signal TESHIZ.

In the read mode, when the output stop signal TESHIZ has an L (Low) level, one of the transistors Tr1 and Tr2 in the input/output circuit 6 is turned on according to read data RD, causing the read data RD to be output from the data input/output terminal 7. In the write mode, the write data Din sent to the data input/output terminal 7 is inverted by the NOR circuit 10b and is then supplied to a write amplifier (not shown).

On the other hand, when the output stop signal TESHIZ has an H (High) level, both the transistors Tr1 and Tr2 are turned off so that the data input/output terminal 7 is set to a high-impedance state. This causes the output signal Din of the NOR circuit 10b to be fixed at an L level. The input/output circuit 6 therefore becomes inactive.

FIG. 2 is a timing chart illustrating the entry of a test mode of the SDRAM 50.

When a mode register set command MRS is supplied as a command signal CM and a code signal Cod for setting a predetermined test mode is supplied as the address signals A0–An, as shown in FIG. 2, the test-mode decision circuits 4 determine that the mode is a test mode. The test-mode decision circuits 4 then output one of the test mode signals TEST1-TEST4.

The test-mode output control circuit 8 sends the output stop signal TESHIZ to the input/output circuit 6 so that the data input/output terminal 7 is set to a high-impedance state. As a result, read data DQ with a CAS latency of "3" is not output from the data input/output terminal 7 in accordance with, for example, a read command READ.

When a user erroneously enters a test mode of the SDRAM 50, the data input/output operation is automatically inhibited so that the user notices the erroneous entry. This scheme can therefore prevent the device from operating in a test mode that shortens the life of the device, such as a burn-in test mode.

In the case in which a device manufacturer conducts a test on the SDRAM 50 at the time of shipment, even if the mode is set to a test mode, data input/output to or from the data input/output terminal 7 cannot be executed. The device manufacturer cannot test writing and reading data while applying the reliability test to the device.

SUMMARY OF THE INVENTION

Accordingly, it is an object of the present invention to provide a semiconductor device that can reliably detect an erroneous entry into a test mode in ordinary usage and can perform various operational tests at the time of shipment.

To achieve the above object, the present invention provides a semiconductor device including an internal circuit operated in accordance with a plurality of operation modes, including a test mode, and a test-mode control circuit connected to the internal circuit for operating the internal circuit in the test mode in accordance with a test mode command. The test-mode control circuit includes a first control circuit and a second control circuit. The first control circuit is connected to the internal circuit for inactivating at least a part of the internal circuit in accordance with the test mode command. The second control circuit is connected to the first control circuit for activating at least the part of the internal circuit inactivated by the first control circuit in accordance with a release command supplied following the test mode command.

The present invention also provides a semiconductor memory device including an internal circuit operated in accordance with a plurality of operation modes including a test mode, a data write mode, and a data read mode. The internal circuit includes an input/output circuit having a data input/output terminal. The device includes a first control circuit and a second control circuit. The first control circuit is connected to the internal circuit for setting the internal circuit to a test mode and inactivating at least a part of the input/output circuit in accordance with a first command signal for setting the test mode. The second control circuit is connected to the internal circuit for activating at least the part of the input/output circuit inactivated by the first control circuit in accordance with a second command signal supplied following the first command signal, thereby ensuring data input/output in the test mode.

The present invention further provides a method for entering a test mode in a semiconductor device. The semiconductor device has a plurality of operation modes including the test mode, operates in accordance with a plurality of operation commands, and has an internal circuit. The method includes entering the test mode in accordance with a test mode command to be supplied to the semiconductor device, inactivating at least a part of the internal circuit, activating at least the part of the inactivated internal circuit in accordance with a release command supplied following the test mode command, and executing a data write mode and data read mode in the test mode.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
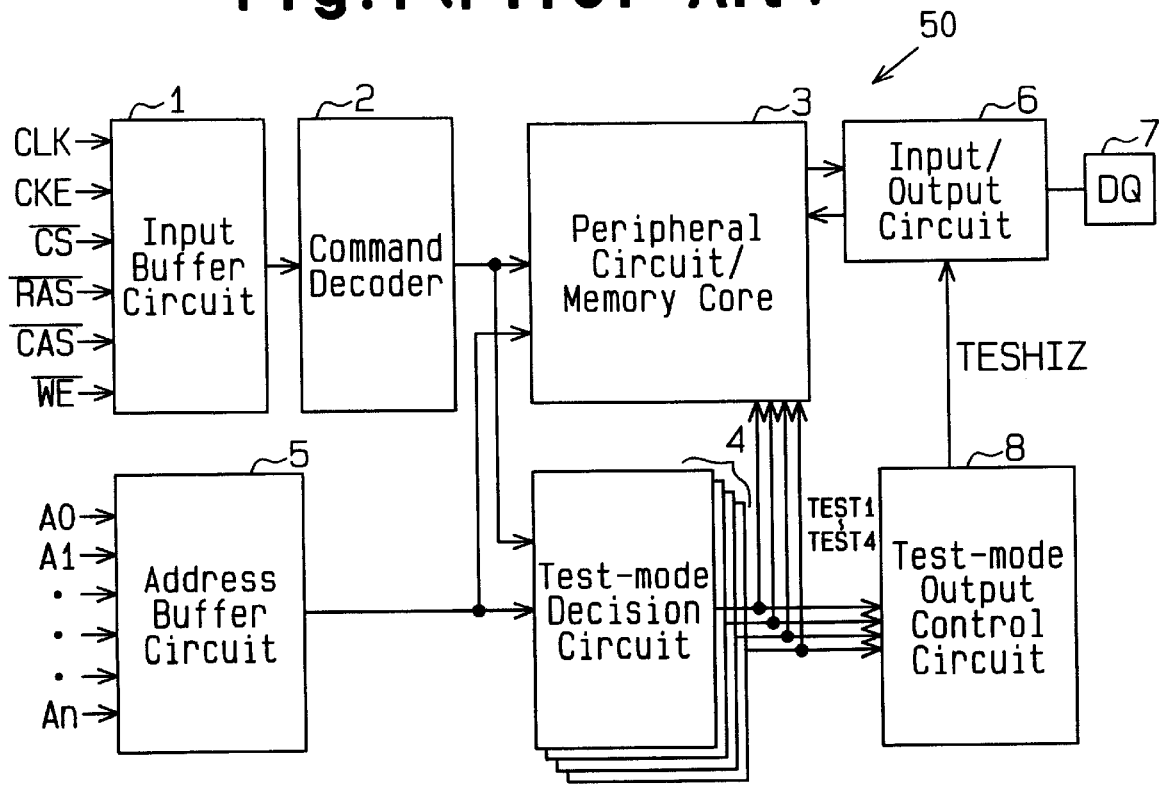
FIG. 1 is a schematic block diagram of a conventional semiconductor device.
Figure 2:
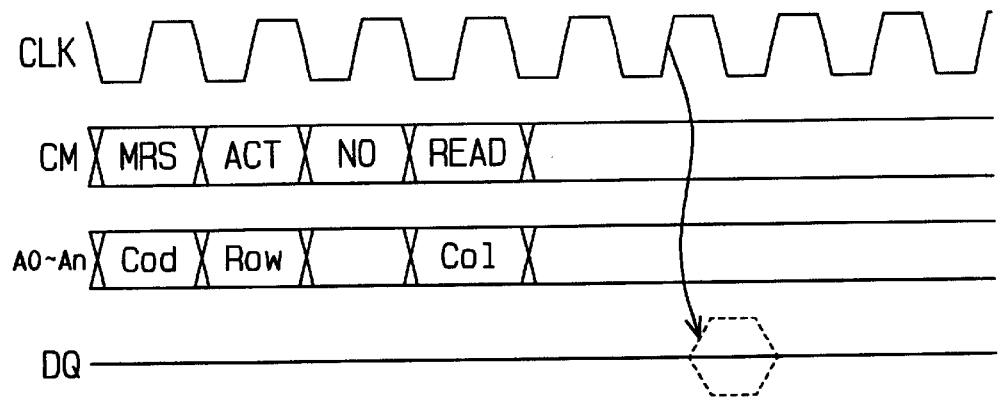
FIG. 2 is a timing chart illustrating an operation to enter a test mode of the semiconductor device in FIG. 1.
Figure 3:
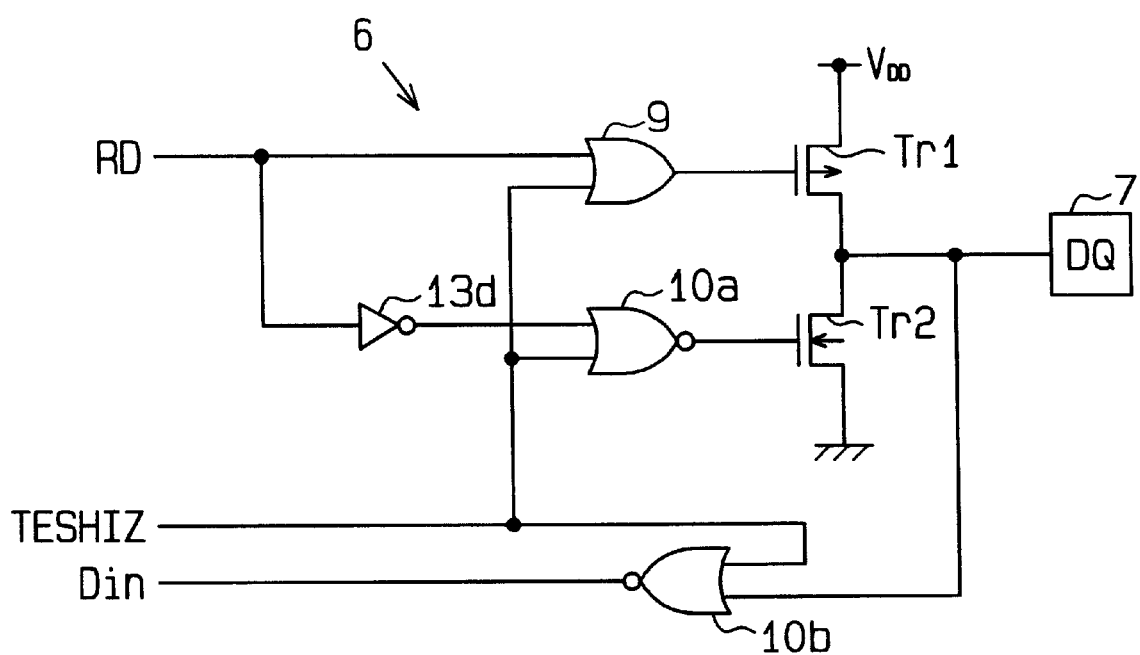
FIG. 3 is a schematic circuit diagram of an input/output circuit of the semiconductor device in FIG. 1.

In the drawings, like numerals are used for like elements throughout.

Figure 4:
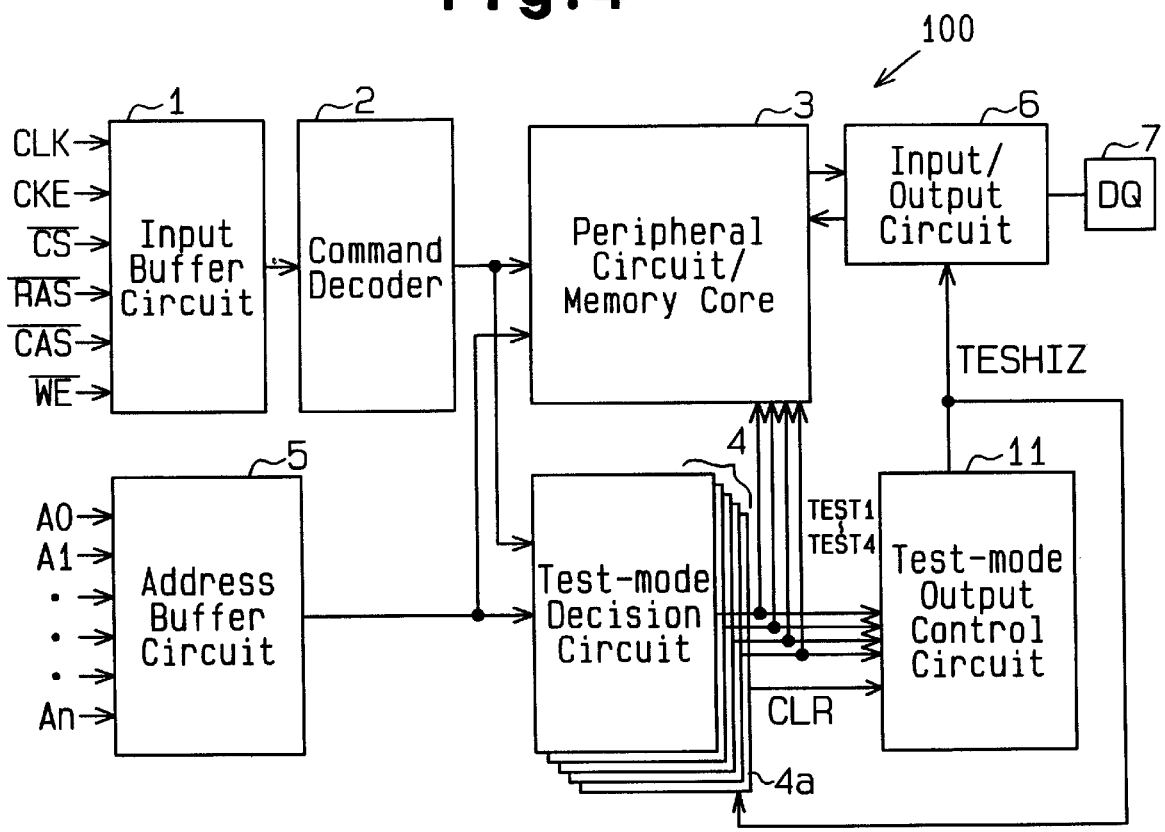
FIG. 4 is a schematic block diagram of a semiconductor device according to one embodiment of the invention.

FIG. 4 is a schematic block diagram of a semiconductor device (SDRAM) 100 according to one embodiment of the present invention.

As shown in FIG. 4, the SDRAM 100 includes an input buffer circuit 1, a command decoder 2, a peripheral circuit/memory core 3, first test-mode decision circuits (first control circuit) 4, an address buffer circuit 5, an input/output circuit 6, a data input/output terminal 7, a test-mode output control circuit (first control circuit) 11, and a second test-mode decision circuit (second control circuit) 4a.

The second test-mode decision circuit 4a generates a clear signal CLR and sends the clear signal CLR to the test-mode output control circuit 11. The test-mode decision circuit 4a receives an output stop signal TESHIZ from the test-mode output control circuit 11.

Figure 5:
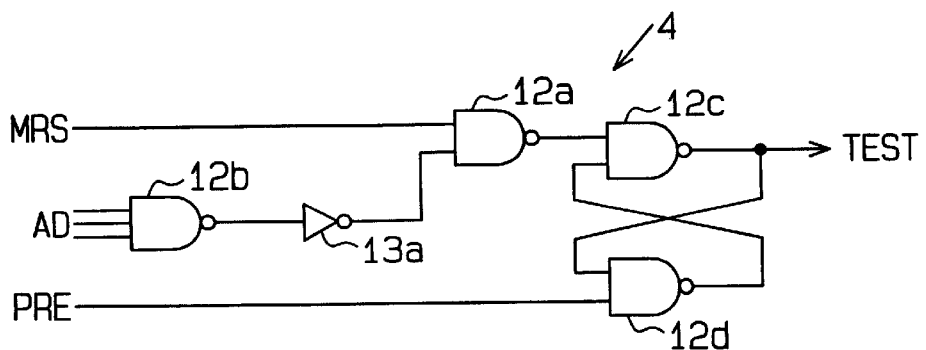
FIG. 5 is a schematic circuit diagram of a first test-mode decision circuit in the semiconductor device in FIG. 4.

FIG. 5 is a schematic circuit diagram of each first test-mode decision circuit 4. A NAND circuit 12a receives an H-level mode register set command MRS (test-mode entry signal) from the command decoder 2.

A NAND circuit 12b receives address signals AD of particular multiple bits of address signals A0–An output from the address buffer circuit 5. When a test mode is set, all address signals AD have H levels and are supplied to the NAND circuit 12b. The first test-mode decision circuits 4 then determine that a test mode has been entered.

The output signal of the NAND circuit 12b is supplied to the NAND circuit 12a via an inverter circuit 13a.

The output signal of the NAND circuit 12a is supplied to a NAND circuit 12c, which outputs a test mode signal TEST. The output signal of the NAND circuit 12c is also supplied to a NAND circuit 12d whose output signal is supplied to the NAND circuit 12c.

The command decoder 2 supplies the NAND circuit 12d with a test-mode release signal PRE. The test-mode release signal PRE is a command to disable part of the peripheral circuit/memory core 3. The NAND circuits 12c and 12d form a latch circuit.

When each first test-mode decision circuit 4 receives the H-level mode register set command MRS, and all of the address signals AD have H levels, the output signal of the inverter circuit 13a goes to an H level. Because the NAND circuit 12a receives two input signals both of H levels, the output signal of the NAND circuit 12a goes to an L level. As a result, the NAND circuit 12c outputs the H-level test mode signal TEST.

When each first test-mode decision circuit 4 receives the H-level test-mode release signal PRE, the test mode signal TEST is latched at an H level by the NAND circuits 12c and 12d, regardless of the mode register set command MRS and the address signals AD.

In the case in which the output signal of the NAND circuit 12a is latched at an H level, when the first test-mode decision circuit 4 receives the L-level test-mode release signal PRE, both input signals to the NAND circuit 12c become H levels. As a result, the test mode signal TEST is reset to an L level.

Figure 6:
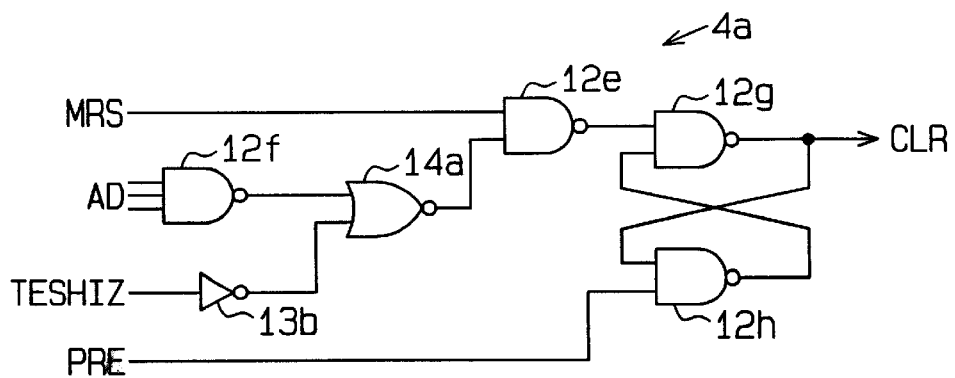
FIG. 6 is a schematic circuit diagram of a second test-mode decision circuit in the semiconductor device in FIG. 4.

FIG. 6 is a schematic circuit diagram of the second test-mode decision circuit 4a.

The second test-mode decision circuit 4a includes NAND circuits 12e, 12f, 12g and 12h, a NOR circuit 14a and an inverter circuit 13b.

The mode register set command MRS is supplied to the first input terminal of the NAND circuit 12e, and the address signals AD of a predetermined number of bits are supplied to the second NAND circuit 12f. The output signal of the NAND circuit 12f is supplied to the first input terminal of the NOR circuit 14a.

If predetermined address signals A0–An are set for releasing the output stop signal TESHIZ, all of the predetermined number of bits of the address signals AD are set to H levels when address signals A0–An are supplied to the address buffer circuit 5.

The output stop signal TESHIZ from the test-mode output control circuit 11 is supplied via the inverter circuit 13b to the second input terminal of the NOR circuit 14a, whose output signal is supplied to the second input terminal of the NAND circuit 12e.

The output signal of the NAND circuit 12e is supplied to the first input terminal of the NAND circuit 12g. The test-mode release signal PRE is supplied to the first input terminal of the NAND circuit 12h. The NAND circuits 12g and 12h form a latch circuit. The NAND circuit 12g outputs the clear signal CLR.

When an H-level output stop signal TESHIZ is supplied to the inverter circuit 13b and the address signals AD all go to H levels, the output signal of the NOR circuit 14a goes to an H level. If an H-level mode register set command MRS is supplied to the NAND circuit 12e, then both input signals to the NAND circuit 12e go to an H level. The output signal of the NAND circuit 12e then goes to an L level, causing the NAND circuit 12g to output the H-level clear signal CLR.

When the H-level test-mode release signal PRE is supplied to the NAND circuit 12h, the clear signal CLR is latched at an H level by the NAND circuits 12g and 12h, irrespective of the mode register set command MRS and the address signals AD.

When the L-level test-mode release signal PRE is supplied to the second test-mode decision circuit 4a with the output signal of the NAND circuit 12e having returned to an H level, both input signals to the NAND circuit 12g go to H levels. This resets the clear signal CLR to an L level.

Figure 7:
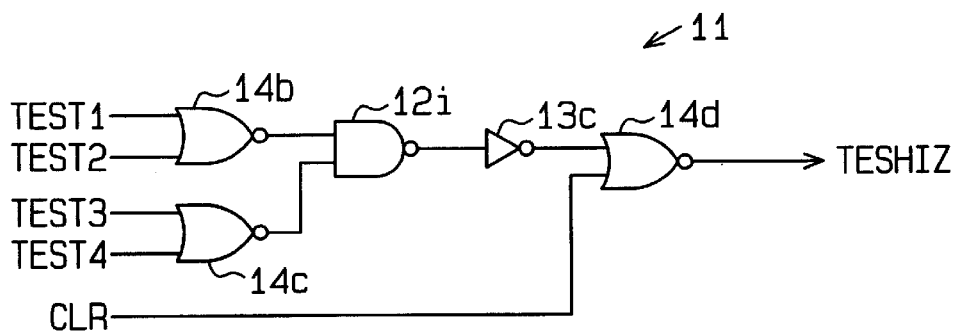
FIG. 7 is a schematic circuit diagram of a test-mode output control circuit in the semiconductor device in FIG. 4.

FIG. 7 is a schematic circuit diagram of the test-mode output control circuit 11.

The test-mode output control circuit 11 includes a NAND circuit 12i, NOR circuits 14b, 14c and 14d and an inverter circuit 13c.

Test mode signals TEST1 and TEST2 are respectively supplied to the first and second input terminals of the NOR circuit 14b, and test mode signals TEST3 and TEST4 are respectively supplied to the first and second input terminals of the NOR circuit 14c. The output signals of the NOR circuits 14b and 14c are respectively supplied to the first and second input terminals of the NAND circuit 12i.

The output signal of the NAND circuit 12i is supplied via the inverter circuit 13c to the first input terminal of the NOR circuit 14d, whose second input terminal is supplied with the clear signal CLR from the test-mode decision circuit 4a. The NOR circuit 14d outputs the output stop signal TESHIZ.

When any of the test mode signals TEST1, TEST2, TEST3, and TEST4 goes to an H level, the output signal of the NAND circuit 12i goes to an H level in the test-mode output control circuit 11. Consequently, the output signal of the inverter circuit 13c goes to an L level. When the clear signal CLR is at an L level, the output stop signal TESHIZ goes to an H level. When the clear signal CLR is at an H level, on the other hand, the output stop signal TESHIZ goes to an L level.

When all of the test mode signals TEST1, TEST2, TEST3, and TEST4 have L levels, both input signals to the NAND circuit 12i go to H levels so that the output signal of the NAND circuit 12i goes to an L level. As a result, the output signal of the inverter circuit 13c goes to an H level, and the output stop signal TESHIZ goes to an L level.

Figure 8:
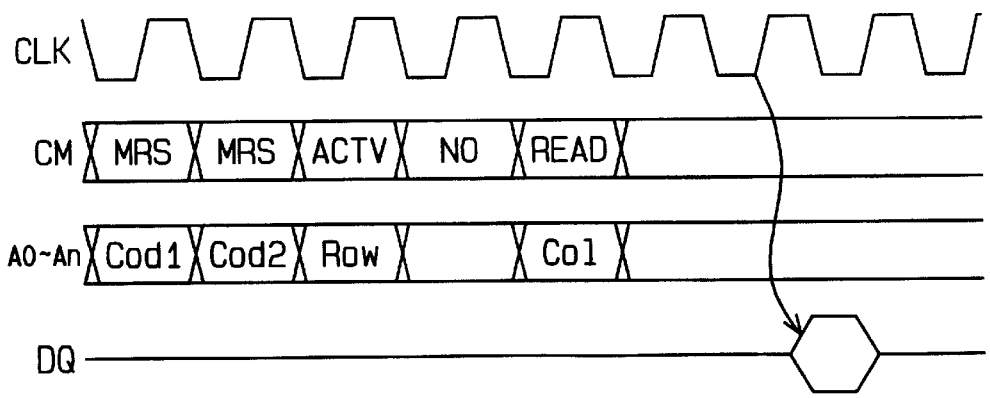
FIG. 8 is a timing chart illustrating an operation to enter a test mode of the semiconductor device in FIG. 4.

FIG. 8 is a timing chart illustrating an operation to enter a test mode of the SDRAM 100.

When the mode register set command MRS and a code signal Cod1 (address signal A0–An) are supplied to the SDRAM 100, as shown in FIG. 8, each test-mode decision circuit 4 determines that the operation mode is a test mode and sets at least one of the test mode signals TEST1, TEST2, TEST3, and TEST4 to an H level.

Then, the test-mode output control circuit 11 outputs the output stop signal TESHIZ, setting the data input/output terminal 7 to a high-impedance state. At this time, the clear signal CLR that is supplied to the test-mode output control circuit 11 from the test-mode decision circuit 4a is set to an L level.

When a user erroneously enters a test mode, therefore, the data input/output operation is automatically inhibited so that the user notices the erroneous entry. This prevents the device from operating in a test mode that'shortens the life of the device, such as a burn-in test mode.

Next, the mode register set command MRS is supplied again to the SDRAM 100 prior to an active command ACT and a code signal Cod2, a release command for the output stop signal TESHIZ. Then, the output signals of the NAND circuit 12f and the inverter circuit 13b in the test-mode decision circuit 4a both go to L levels, causing the output signal of the NAND circuit 12e to go to an L level. As a result, the NAND circuit 12g outputs the H-level clear signal CLR.

When receiving the H-level clear signal CLR from the test-mode decision circuit 4a, the test-mode output control circuit 11 outputs the L-level output stop signal TESHIZ regardless of the test mode signals TEST1, TEST2, TEST3, and TEST4.

Consequently, the input/output circuit 6 is enabled again, and the data input/output terminal 7 is set to a low-impedance state. This allows data to be written in or read from the peripheral circuit/memory core 3. In a read operation, as shown in FIG. 8, for example, read data DQ is output at a timing with the CAS latency of "3". Data writing is likewise possible. The code signal Cod2 (release command) is effective until a reset command is supplied to the SDRAM 100.

It is very unlikely that a user supplies two types of code signals Cod1 and Cod2, which are normally not accessible to the public, to the SDRAM 100 erroneously and consecutively. This can allow a device manufacturer to conduct a reliable upon-shipment test necessary to reduce the number of defective devices while providing a user with a failsafe capability.

The SDRAM 100 of this embodiment has the following advantages.

(1) When a user erroneously enters a test mode, the data input/output terminal 7 is set to a high-impedance state, thus inhibiting the data input/output operation. This allows the user to notice the erroneous entry.

(2) At the time of making an upon-shipment test, the device manufacturer can enter a test mode by supplying the mode register set command MRS and code signal Cod1 to the SDRAM 100. As the device manufacturer supplies the mode register set command MRS and the code signal Cod2 for releasing the output stop signal TESHIZ to the SDRAM 100, data input/output operation becomes possible. The device manufacturer can reliably make a test of writing and reading data while applying the reliability test to the device.

(3) Neither code signal Cod1 nor Cod2 is accessible to the public. It is therefore very unlikely that a user inputs the code signals Cod1 and Cod2, together with the mode register set command MRS, erroneously and consecutively. This prevents the user from erroneously entering a test mode and performing a data input/output operation in a test mode.

It should be apparent to those skilled in the art that the present invention may be embodied in many other specific forms without departing from the spirit or scope of the invention. Particularly, it should be understood that the invention may be embodied in the following forms.

The control that sets the data input/output terminal 7 to a high-impedance state upon reception of the output stop signal TESHIZ is not limited to the control on the input/output circuit 6 in the present embodiment. Impedance control on the data input/output terminal 7 may be executed as the output stop signal TESHIZ is supplied to, for example, a read amplifier for amplifying read data or a write amplifier for writing data in memory cells.

Therefore, the present examples and embodiment are to be considered as illustrative and not restrictive and the invention is not to be limited to the details given herein, but may be modified within the scope and equivalence of the appended claims.

What is claimed is:

1. A semiconductor device comprising:
an internal circuit operated in accordance with a plurality of operation modes including a test mode; and
a test-mode control circuit, connected to the internal circuit, for operating the internal circuit in the test mode in accordance with a test mode command,
the test-mode control circuit including:
a first control circuit, connected to the internal circuit, for inactivating at least a part of the internal circuit in accordance with the test mode command, and
a second control circuit, connected to the first control circuit, for activating at least the part of the internal circuit inactivated by the first control circuit in accordance with a release command supplied following the test mode command.

2. A semiconductor memory device comprising:
an internal circuit operated in accordance with a plurality of operation modes including attest mode, a data write mode and a data read mode, the internal circuit including an input/output circuit having a data input/output terminal;
a first control circuit, connected to the internal circuit, for setting the internal circuit to the test mode and inactivating at least a part of the input/output circuit in accordance with a first command signal for setting the test mode; and
a second control circuit, connected to the internal circuit, for activating at least the part of the input/output circuit inactivated by the first control circuit in accordance with a second command signal supplied following the first command signal, thereby ensuring data input/output in the test mode.

3. The semiconductor memory device according to claim 2, wherein the first control circuit includes:
a first test-mode decision circuit, connected to the internal circuit, for supplying a test mode signal to the internal circuit in accordance with the first command signal and causing the internal circuit to operate in the test mode, and
a test-mode output control circuit, connected to the first test-mode decision circuit and the input/output circuit, for inactivating at least a part of the input/output circuit in accordance with the test mode signal; and wherein the second control circuit includes a second test-mode decision circuit, connected to the test-mode output control circuit, for supplying a clear signal to the test-mode output control circuit in accordance with the second command signal, thereby activating at least the part of the input/output circuit inactivated by the test-mode output control circuit.

4. The semiconductor memory device according to claim 3, wherein the test-mode output control circuit sets the data input/output terminal to a high-impedance state by inactivating the input/output circuit; and wherein
the second test-mode decision circuit sets the data input/output terminal to a low-impedance state by activating the input/output circuit.

5. A method of entering a test mode in a semiconductor device which has a plurality of operation modes including a test mode, operates in accordance with a plurality of operation commands, and has an internal circuit, the method comprising the steps of:
entering the test mode in accordance with a test mode command to be supplied to the semiconductor device;
inactivating at least a part of the internal circuit;
activating at least the part of the inactivated internal circuit in accordance with a release command supplied following the test mode command; and
executing a data write mode and a data read mode in the test mode.

6. The method according to claim 5, wherein the internal circuit includes an input/output circuit having a data input/output terminal; and wherein
the step of inactivating at least a part of the internal circuit includes a step of inactivating at least a part of the input/output circuit to thereby set the data input/output terminal to a high-impedance state; and
the step of activating at least the part of the inactivated internal circuit includes a step of activating at least the part of the input/output circuit to thereby set the data input/output terminal to a low-impedance state.

7. The method according to claim 5, wherein the release command is effective until a reset command is supplied to the semiconductor device.

8. The method according to claim 5, wherein the release command is supplied to the semiconductor device between the test mode command and an active command to be supplied to the semiconductor device.

* * * * *